United States Patent [19]

Beucler et al.

[11] Patent Number: 4,779,273
[45] Date of Patent: Oct. 18, 1988

[54] APPARATUS FOR SELF-TESTING A DIGITAL LOGIC CIRCUIT

[75] Inventors: Frederick P. Beucler, Grafton; Patrick Curley, North Grafton; Michael Manner, Framingham, all of Mass.

[73] Assignee: Data General Corporation, Westboro, Mass.

[21] Appl. No.: 54,109

[22] Filed: May 20, 1987

Related U.S. Application Data

[63] Continuation of Ser. No. 620,367, Jun. 14, 1984, abandoned.

[51] Int. Cl.⁴ .............................................. G01R 31/28
[52] U.S. Cl. ......................................... 371/25; 371/27
[58] Field of Search ............................ 371/25, 27, 21; 364/200, 900; 324/73 R, 73 AT, 73 PC

[56] References Cited

U.S. PATENT DOCUMENTS

| | | | |
|---|---|---|---|
| 3,714,571 | 1/1973 | Walker | 371/25 |
| 3,814,920 | 6/1974 | Huelters | 371/25 |
| 4,176,780 | 12/1979 | Sacher | 371/25 |
| 4,497,056 | 1/1985 | Sugamori | 371/25 |
| 4,498,172 | 2/1985 | Bhavsar | 371/25 |
| 4,503,536 | 3/1985 | Panzer | 371/25 |
| 4,503,537 | 3/1985 | McAnney | 371/25 |
| 4,513,418 | 4/1985 | Bardell | 371/25 |
| 4,517,672 | 5/1985 | Pfleiderer | 371/25 |
| 4,523,312 | 6/1985 | Takeuchi | 371/25 |
| 4,534,028 | 8/1985 | Trischler | 371/25 |
| 4,546,473 | 10/1985 | Eichelberger | 371/25 |
| 4,571,724 | 2/1986 | Belmondo | 371/27 |
| 4,584,683 | 4/1986 | Shimizu | 371/25 |
| 4,594,711 | 6/1986 | Thatle | 371/25 |
| 4,601,034 | 7/1986 | Sridhar | 371/25 |

OTHER PUBLICATIONS

Smith, J. E., "Measures of the Effectiveness of Fault Signature Analysis", IEEE Transactions on Computers, vol. 29, Jun. 1980.

Williams, T. W. "Design for Testability-A Survey", IEEE Transactions on Computers, vol. 31, No. 1, 1/82.

*Primary Examiner*—Michael R. Fleming

[57] ABSTRACT

A method is disclosed that lends itself to efficient incorporation in digital logic networks to enable such networks to automatically test themselves in place. A register is incorporated in the network in such a manner that a data pattern loaded in the register may be input to the network and the resultant outputs of the network may be captured in the same register. The resultant pattern may then be modified and the process repeated a number of times, after which the final pattern is compared with an expected one to verify correct operation of the network.

3 Claims, 4 Drawing Sheets

APPARATUS FOR SELF-TESTING A DIGITAL LOGIC CIRCUIT

This application is a continuation of application Ser. No. 620,367, filed June 14, 1984, now abandoned.

CROSS-REFERENCE TO RELATED APPLICATIONS

There are no related applications.

BACKGROUND OF THE INVENTION

1. Field of the Invention

This invention relates to the testing of digital logic arrays of the type useful in digital computer systems, and particularly to methods of providing built-in automatic testing of such arrays without removing them from the systems of which they are part.

2. Description of the Prior Art

References:
Application Articles on Signature Analysis, 1979, Hewlett-Packard Application Note #222-2, Hewlett-Packard Publication 5952-7542.
Williams, T. and Parker, K., "Design for Testability—A Survey", IEEE Transactions on Computers, January 1982.

Logic arrays are networks of logic circuits (AND gates, OR gates, flip-flops, and the like) that perform some logical function (e.g., instruction decoding, interrupt dispatching). Digital data systems and digital computers generally comprise interconnected logic arrays.

Recent developments in integrated circuit technology have enabled whole arrays to be packaged as single entities; this in turn has made it desirable to be able to comprehensively test the entity without removing it from the system of which it is a part. Such a test need only indicate whether the array as a whole is functional, and need not diagnose the nature of malfunctions since the usual remedy is to replace the entire entity.

Considerable work has been done relating to methods of self-testing logic arrays. One possible method involves a GO/NO-GO type test that can be executed automatically upon power-up or at any time by asserting a control line on the array to the appropriate state, which results in applying an input pattern to the array and verifying that the output pattern is as expected. This method has limitations; the limited number of input patterns that may be produced as a result of asserting a single control line may not represent a comprehesive test of the array and thus many failures may go undetected. The GO/NO-GO type test can be applied to any logic array, but it is expensive to implement on a highly combinatorial array; highly combinatorial arrays (as opposed to highly registered arrays) require the addition of hardware at the inputs and outputs to buffer the requisite data patterns. This additional hardware consumes array cells. Arrays that are highly registered only require additional hardware to adapt the registers to be more amenable to self-testing. This consumes cells, but not as many as those consumed for a combinatorial type.

Another method, known as SCAN, involves extracting out stored data from within the array during a procedure specifically targeted toward analyzing the extracted data in order to diagnose a problem. A drawback of this method is that the amount of prestored data is inherently limited, and may not represent a sufficient number of patterns to comprehensively test the array, resulting in undetected failures. And, the SCAN method does not apply to highly combinatorial arrays because there is little or no internally registered data; this method better lends itself to highly registered arrays.

Other methods involve the use of external intelligence to generate data patterns and input them to the array under test, and the use of other external intelligence to receive and analyze the outputs. Such methods may be effective, but one of their drawbacks is that they are time-consuming. And the required external intelligence takes them out of the self-test category anyway.

Another previously known self-test method employs a register at the inputs to a logic array and a similar register at the outputs. These registers are used to generate pseudorandom patterns that propagate through the array and generate a set of patterns specific to the array. These patterns can be captured and compressed using signature analysis methodology to generate a single word that characterizes the array relative to the stimulating patterns. This method has the acronym "BILBO", derived from "Built-In Logic Block Observer". If this resultant word is EXCLUSIVE OR'ed with an internally stored expected result, a single GO/NO-GO indication can be generated.

Logic simulation techniques were employed to evaluate a BILBO implementation with a typical logic array (an instruction decoder). The BILBO methodology was found to provide an effective self-test of the array, but a major disadvantage related to the amount of circuitry necessary to implement the test, which consumed roughly one-third of the cells comprising the array. This was deemed to be excessive, and applicants sought a way of providing an adequate self-test mechanism that would not add so much circuitry overhead.

An adaptation of BILBO that was investigated was to "team" two arrays and two BILBO registers in such a manner that when one array is to be tested the first register provides its input and the second register collects its output, and when the second array is to be tested the second register provides its input and the first register collects its output. While this approach does effect some reduction in circuitry overhead, it was not quite a 50% reduction since added complexity is introduced in order to configure for the different modes of testing. Another significant drawback of this approach is that constraints are introduced on the physical placement of the two arrays relative to each other, since they must now interact in ways that would be unnecessary but for the added self-testing feature.

SUMMARY OF THE INVENTION

The present invention overcomes the aforementioned deficiencies and drawbacks of the prior art, and enables efficient self-test of a logic array by incorporating in the array a single register which is initially loaded with a test data pattern for input to the array. The same register is then used to capsure the output of the array and compress the output according to signature analysis methodology, yielding a new test data pattern. The new pattern is then input to the array and the process repeated a predetermined number of times (ideally, a sufficient number of times to allow all possible data patterns to be presented to the array) after which the final data pattern may be compared with an expected result, thus verifying proper operation of the array.

The advantage of the present invention is that it provides a reasonably complete and comprehensive self-test of a logic array that may be executed quickly and does not require an excessive amount of additional circuitry.

It is thus a general object of the present invention to facilitate construction of digital data systems and digital computer systems.

It is an additional object of the present invention to provide an improved method of testing logic arrays.

It is a further object of the present invention to provide a method of self-testing logic arrays.

It is yet a further object of the present invention to provide a method of self-testing logic arrays that does not require that an excessive amount of circuitry be added to the array to facilitate the test.

It is yet a further object of the present invention to provide a method of self-testing logic arrays that can be performed rapidly.

It is another object of the present invention to provide a method of self-testing logic arrays that can provide a single GO/NO-GO indication.

It is yet another object of the present invention to provide a method of testing logic arrays that does not require removal of the arrays from the systems of which they are a part.

It is an additional object of the present invention to provide a means of testing logic arrays at their operating speed in order to facilitate detection of parametric failures.

Other advantages of the present invention will be apparent to those skilled in the art.

DESCRIPTION OF THE PREFERRED EMBODIMENTS

The vehicle chosen to evaluate the method of the present invention is an instruction decoder gate array denoted "SLIC" (Single-Level Instruction Cracker). The means of evaluation is a gate array simulation program known as "TEGAS".

Figure 1:
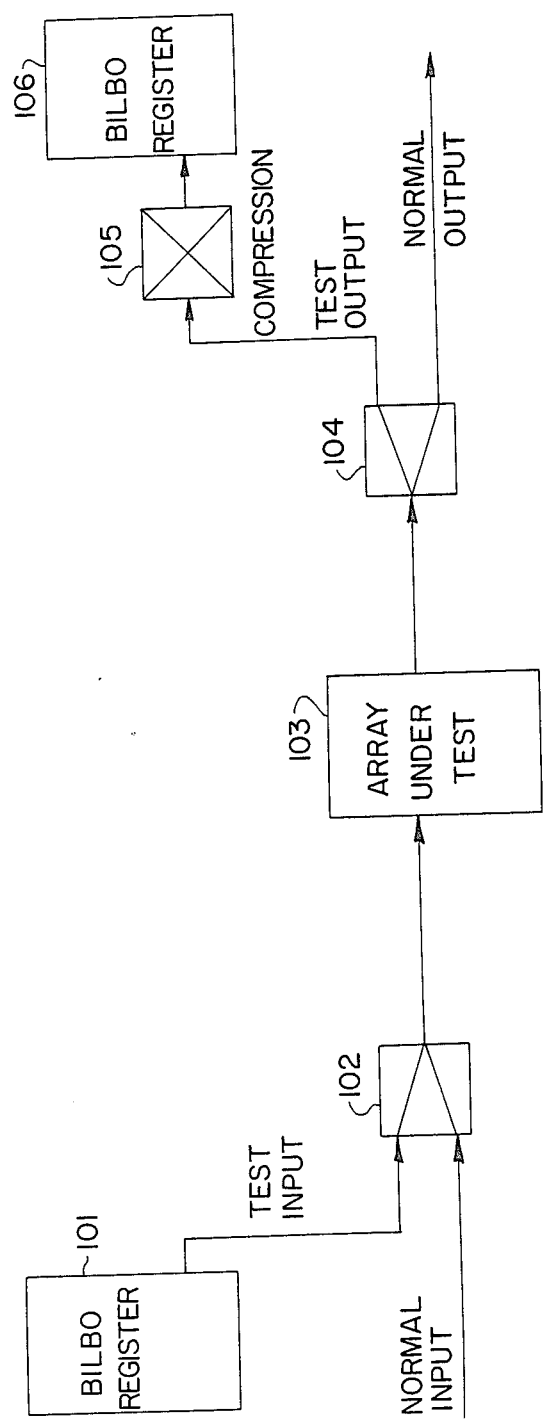
FIG. 1 (prior art) is an overview of the BILBO (Built In Logic Block Observer) system for self-testing a logic array.

The first task undertaken was to design the pattern generator and signature compressor that characterize a BILBO test. A BILBO register is a series of single D-type flip flops with some interconnecting logic. This BILBO register has four operating modes. The first is normal mode whereby the BILBO register is parallel loaded and the register acts as a normal n-bit wide register. The second mode is shift mode, whereby the value contained in bit position i is copied into bit position i+1. The third mode is the linear feedback mode. In this mode the register uses multiple feedback to allow the register to either generate pseudorandom patterns or compress data into a single word. The fourth mode is the initialize mode, used to initialize the register to some desired state. This function can be used to load the first seed of the pattern sequence. Typical BILBO applications use two BILBO registers (see FIG. 1). The first BILBO regiser (101) is used at the front end of the circuit to generate the pseudorandom test patterns. These patterns are multiplexed (102) with the normal input, and passed through the array to be tested (103). The patterns passing from the array being tested are demultiplexed (104) from the normal output, compressed (105), and input to the second BILBO register (106). The compression yields a word that characterizes the array relative to the test patterns passed through it. Allowing the pattern generator to generate patterns over a specific time period, and allowing the signature compressor to compress the array-altered patterns over the same period results in the signature register holding the characteristic word. Faults in the array under test or the BILBO logic result in a characteristic word different from that expected.

The BILBO hardware was designed, integrated with the SLIC simulation description, and was run through the TEGAS simulator. The array was simulated using the same test patterns that had been used to verify the original design of SLIC, yielding no deviations from the original simulation results, which indicated that the addition of the BILBO hardware to the simulation had not altered the characteristics of the SLIC device.

Gate counting was used to determine the real estate consumption attributable to adding the BILBO circuitry. The consumption when using the front-end pattern generator and the back-end signature compressor was 36%. Since this was larger than the desired 10-15%, this approach was deemed unusable.

Figure 2:
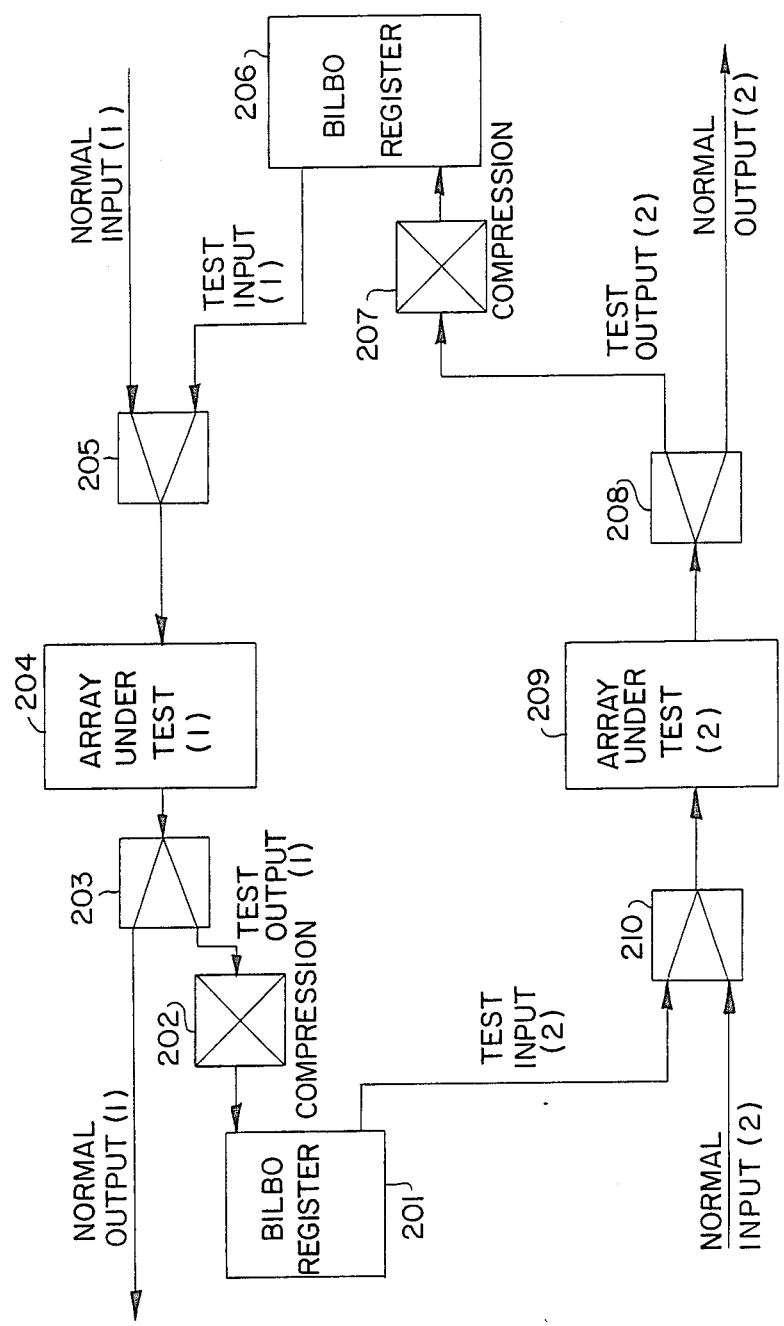
FIG. 2 (prior art) is an overview of an adaptation of the BILBO system where the same BILBO circuitry is employed to test either of two logic arrays.

A BILBO variation in which two arrays are teamed so as to be tested by the same two BILBO registers (see FIG. 2) was considered. When it is desired to test array 1 (204), BILBO register 206 is loaded with the data pattern, multiplexor 205 passes the pattern to array 204, demultiplexor 203 passes the array's outputs to compressor 202, and BILBO register 201 collects the compressed outputs. Similarly, when it is desired to test array 2 (209), BILBO register 201 is loaded with a data pattern which passes through multiplexor 210, through array 209, through demultiplexor 208 and compressor 207, whence the compressed outputs are captured in BILBO register 206.

This approach was rejected because of the complexity involved in adapting for the different modes of testing and because of the constraints the method imposes on the physical placement of the two arrays relative to each other.

Therefore, the BILBO approach was abandoned and work was begun on the present invention. The final design employs a pattern generaor/signature compressor combined in the same register and uses the array being tested as part of a feedback path (see FIG. 3). This design was labeled "HILDO", which denotes "Highly Integrated Logic Design Observer".

HILDO, a BILBO derivative, halves the real estate consumption by using one register to both generate the patterns and compress the test results. The technique involves feeding the compressed signature through the array under test. The test array becomes a portion of the feedback path.

Figure 3:
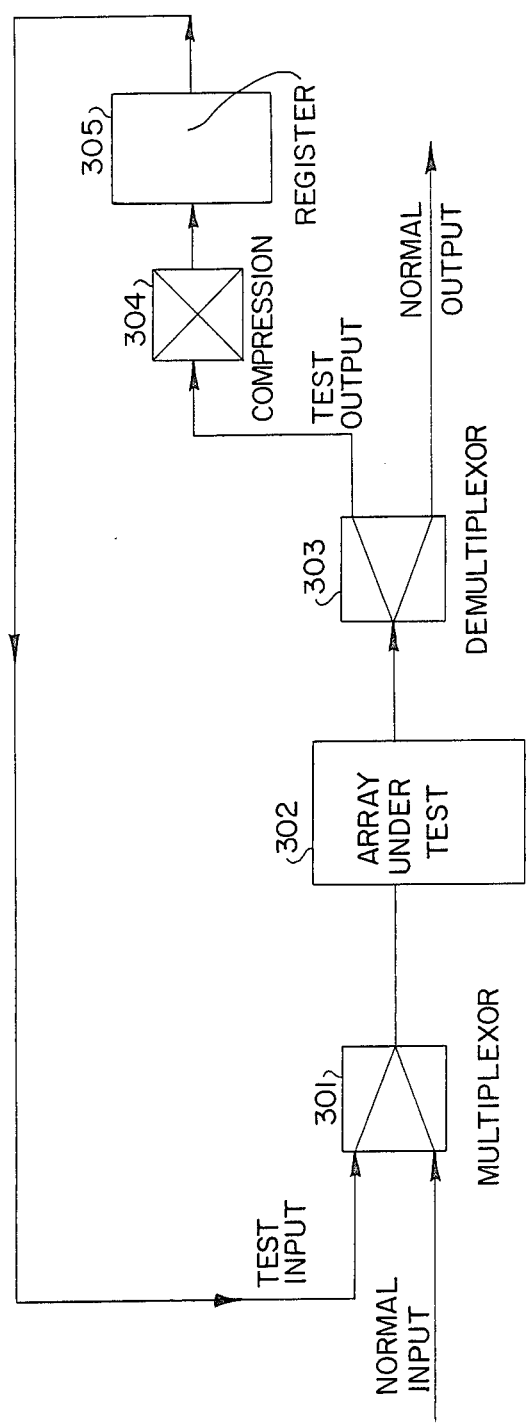
FIG. 3 is an overview of the self-test system upon which the method of the present invention is practiced.

With reference to FIG. 3, which is an overview of the HILDO method, it is seen that register 305 is loaded with the initial test data pattern. Multiplexor 301 receives the pattern over feedback line 306 and inputs it the array under test 302. Demultiplexor 303 passes the resultant array outputs to compressor 304, and the compressed signature is captured in register 305.

Figure 4:
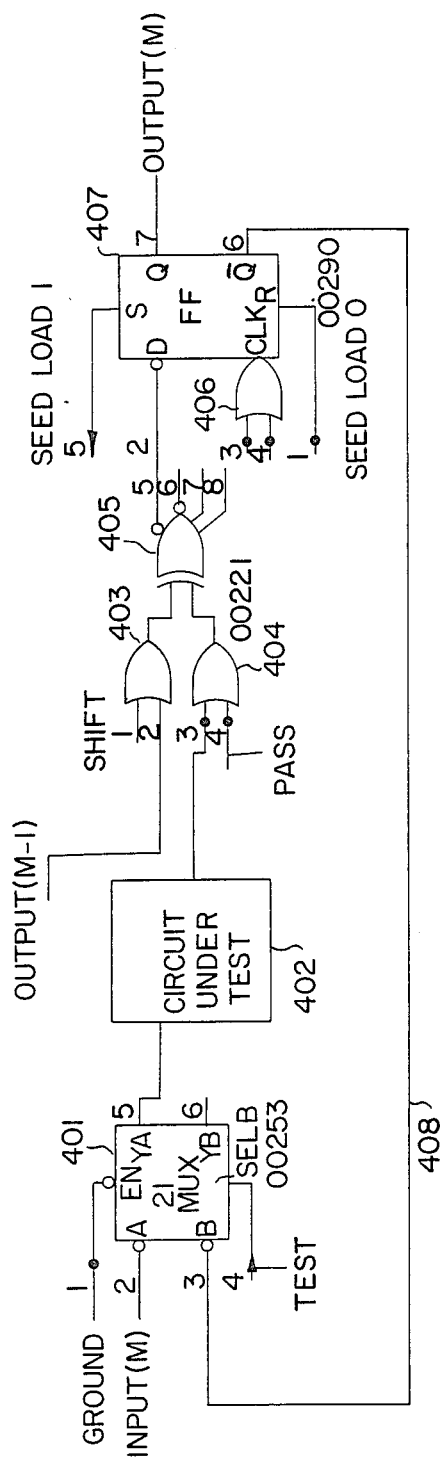
FIG. 4 is a logic diagram of one cell of the preferred embodiment of the present invention.

FIG. 4 shows the actual logic configuration of one cell (i.e., one bit position) of a HILDO system. Flip-flop 407 is one state of the HILDO register, and is seen to have provision for loading the initial data pattern, or "seed", through its S and R inputs. If the TEST signal is active to multiplexor 401, the output of flip-flop 407, as received over feedback line 408, will be passed through multiplexor 401 and input to the array under test (402). Referring to gates 403, 404, and 405, it is seen that activation of the PASS signal alone will result in simply passing the array output on to flip-flop 407 while simultaneous activation of the PASS and SHIFT signals result in passing the EXCLUSIVE-OR of the array output and the contents of the flip-flop of the adjacent sell, thus effecting signature compression. Application of a clock signal at an appropriate time to gate 406 will result in capturing the (normal or compressed) output in flip-flop 407.

HILDO's gate consumption is reduced as compared to BILBO, but the payment for this is a reduction in the pattern sequence length. By design, a BILBO register generates $2^n$ unique patterns, n being the bit width of the register. Some pattern generators don't develop $2^n$ patterns. Since BILBO does, it is called a maximum length generator. HILDO cannot guarantee the maximum length sequence because the feedback through the array under test alters the characteristics of the generator. The amount of reduction can be mathematically determined, but this is tedious; it is more feasible to determine the sequence length by simulation means.

HILDO yielded a sequence of approximately 1000 unique patterns on SLIC before repetition occurred. Several attempts were made to increase this number. One method was to feed the inverted outputs from the signature register back to SLIC instead of the non-inverted outputs. This increased our pattern count before repeat to approximately 2000. Most of our investigation and simulation time was spent using this hardware configuration.

Various features of the TEGAS simulator were then used to determine the efficacy of the test pattern set.

One mode of TEGAS is called DFS. This mode consists of running a single pass simulation with all possible patterns and recording which nodes of the array do no change logic level during the simulation. If a node does not change to a logic 0 state, then a stuck-at-1 fault on that node is indistinguishable from the correct operation of the array relative to the test pattern set. The results of DFS indicates the maximum potential fault comprehension. The actual fault detection percentage must be obtained in a different manner (such as COPTR, see below). DFS should be used to determine the "testability" factor of the intended design.

Another mode of TEGAS is called COPTR. This feature analyzes an array and indicates the relative testability of the array. It also indicates the relative difficulty in controlling every node of the array and the relative difficulty in observing every node. Analyzing this feature's results indicates which nodes are difficult to control, which means that such nodes should be made stimulus points. It also indicates which nodes are difficult to observe, which means that such nodes should be made response points.

An attempt was made to determine if there was any useful correlation between the DFS mode results and the fault detection simulation mode results. If there was a correlation, one could evaluate the test pattern set by running a single simulation pass instead of repeated fault simulations. DFS and fault detection simulations of the full HILDO/SLIC circuit were run using a software-generated test pattern set and have plotted the results. It appears that there is no guarantee that a high DFS score implies a high fault detection score. The only guarantee is that if an array node does not change from logic state A to logic state B, then a "stuck-at-A" fault cannot be detected. The higher the DFS score, the higher the potential fault detection score. See table 1.

An attempt was made to determine if there was a relationship between test pattern set size and fault detection percentage. Eleven simulations on the same array were run using different test pattern sets. Each subsequent test pattern set was a superset of the previous one. The results are shown in graph 1.

Then an effort was made to determine if the initial seed might alter the test pattern sequence and therefore the fault detection percentage. A 10000 count test pattern set was derived and split it up into 5 groups of 2000 patterns each. No repeating of patterns occurred within this 10000 count sequence. A DFS simulation and fault simulation was run using each test pattern group. It was found was that the fault detection percentage was not dependent upon the seed. The fault detection percentages recorded were all the same, about 40%, while the DFS scores all remained close, about 87%. It appears that the initial seed value has little to do with the quality of the test program. The patterns will be just as random no matter where they start in the sequence. See graph 2.

To date no alternate method has been found of determining actual fault detection comprehension by means other than a fault simulation. One method of approximating the fault detection percentage is to pick, at random, 10% of the faults in the collapsed fault list available through TEGAS GENERATE feature. Statistics show that this random sample has the same probability characteristics as the complete set. Running the sample set through the fault simulator will generate a fault detection percentage that is within 2% of the actual percentage and has a 95% probability of being correct.

TABLE 1

| DFS score vs % fault detection | | |
|---|---|---|
| # unique patterns | DFS score | fault detect score |
| 2 | 79 | 11 |
| 8 | 85 | 28 |
| 22 | 86 | 39 |
| 120 | 86 | 41 |
| 520 | 87 | 41 |
| 1020 | 87 | 41 |
| 2020 | 87 | 41 |

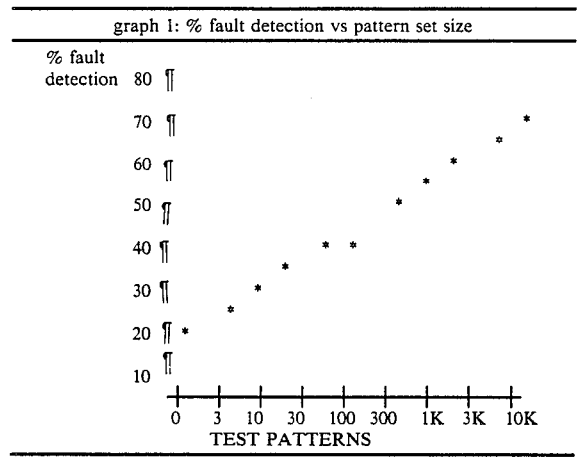

graph 1: % fault detection vs pattern set size

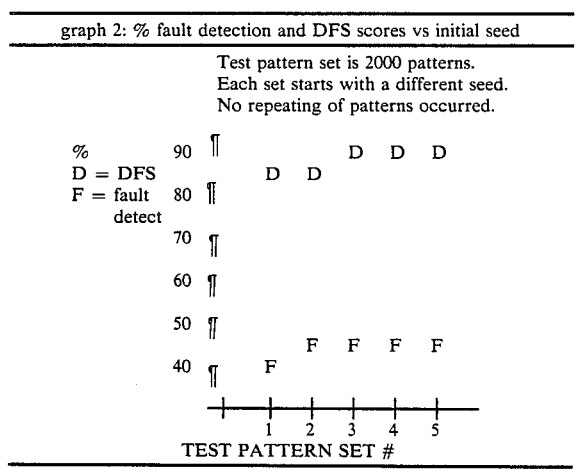

graph 2: % fault detection and DFS scores vs initial seed

Although this invention has been shown and described with respect to a particular embodiment thereof, it should be understood by those skilled in the art that various changes and omissions in the form and details of the invention may be made therein without departing from the spirit and scope of the invention.

What is claimed is:

1. Apparatus for self-testing a digital logic network (302), the network having one or more inputs for accepting input signals and one or more outputs for providing output signals, the network when operating correctly producing determinate output signals for a determinate set of input signals, the network being a part of a digital system and being for receiving input signals from a first portion of the digital system, producing predetermined output signals in response to those input signals, and forwarding the output signals to a second portion of the digital system, the apparatus being integral to the digital system and comprising:

(a) not more than one register (305) for containing an input data pattern and for capturing an output data pattern;

(b) first routing means (301) connected between the outputs of said register and the inputs of the digital logic network for selectably routing the data pattern from said register or from the first portion of the digital system to the digital logic network's inputs; and (c) second routing means (303) connected between the outputs of the digital logic network and the inputs of said register for selectably routing the digital logic network's output signals into said register or to the second portion of the digital system; whereby said register both provides determinate input signals to, and collects output signals from, the digital logic network, correct operation of the digital logic network being indicated by agreement between the collected output signals and expected output signals for that determinate input.

2. Apparatus for self-testing a digital logic network (302), the network having one or more inputs for accepting input signals and one or more outputs for providing output signals, the network when operating correctly producing determinate output signals for a determinate set of input signals, the network being a part of a digital system and being for receiving input signals from a first portion of the digital system, producing predetermined output signals in response to those input signals, and forwarding the output signals to a second portion of the digital system, the apparatus being integral to the digital system and comprising:

(a) not more than one register (305) for containing an input data pattern and for capturing an output data pattern;

(b) first routing means (301) connected between the outputs of said register and the inputs of the digital logic network for selectably routing the data pattern from said register or from the first portion of the digital system to the digital logic network's inputs;

(c) compression means (304) connected to the inputs of said register for compressing data into a signature; and (d) second routing means (303) connected between the outputs of the digital logic network and the inputs of the compression means for selectably routing the digital logic network's output signals into the compression means or the second portion of the digital system;

whereby said register both provides determinate input signals to, and collects signatures from, the digital logic network, correct operation of the digital logic network being indicated by agreement between the collected signatures and expected signatures for that determinate input.

3. Apparatus for self-testing a digital logic network (302), the network having one or more inputs for accepting input signals and one or more outputs for providing output signals, the network when operating correctly producing determinate output signals for a determinate set of input signals, the network being a part of a digital system and being for receiving input signals from a first portion of the digital system, producing predetermined output signals in response to those input signals, and forwarding the output signals to a second portion of the data system, the apparatus being integral to the digital system and comprising:

(a) not more than one register (305) for containing an input data pattern and for capturing an output data pattern;

(b) first routing means (301) connected between the outputs of said register and the inputs of the digital logic nertwork for selectably routing the data pattern from said register or from the first portion of the digital system to the digital logic network's inputs;

(c) compression means (304) connected to the inputs of said register for compressing data into a signature;

(d) second routing means (303) connected between the outputs of the digital logic network and the inputs of the compression means for selectably routing the digital logic network's output signals into the compression means or to the second portion of the digital system; and (e) feedback means for repetitive cycling of the signature through the first routing means, digital logic network, second routing means, compression means and said register a predetermined number of times to provide a final signature;

whereby said register both repetitively provides determinate input signals to, and repetitively collects signatures from, the digital logic network, correct operation of the digital logic network being indicated by agreement between the final signature and an expected signature for that determinate input.

* * * * *